United States Patent
Bishop et al.

(10) Patent No.: US 10,295,582 B2
(45) Date of Patent: May 21, 2019

(54) READ OUT OF QUANTUM STATES OF MICROWAVE FREQUENCY QUBITS WITH OPTICAL FREQUENCY PHOTONS

(71) Applicant: International Business Machines Corporation, Armonk, NY (US)

(72) Inventors: Lev S. Bishop, Westchester, NY (US); Jay M. Gambetta, Yorktown Heights, NY (US); Jason S. Orcutt, Katonah, NY (US); Hanhee Paik, Danbury, CT (US); James R. Rozen, Peekskill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 310 days.

(21) Appl. No.: 15/198,240

(22) Filed: Jun. 30, 2016

(65) Prior Publication Data
US 2018/0003753 A1 Jan. 4, 2018

(51) Int. Cl.
*G01R 29/08* (2006.01)
*G06N 99/00* (2019.01)
*G06N 10/00* (2019.01)

(52) U.S. Cl.
CPC ..... *G01R 29/0885* (2013.01); *G01R 29/0892* (2013.01); *G06N 10/00* (2019.01); *G06N 99/002* (2013.01)

(58) Field of Classification Search
None
See application file for complete search history.

(56) References Cited

U.S. PATENT DOCUMENTS

| 5,103,495 A | 4/1992 | Goutzoulis |
| 5,381,147 A * | 1/1995 | Birkmayer ............ G02F 7/00 341/137 |

(Continued)

FOREIGN PATENT DOCUMENTS

| EP | 2797038 A2 | 10/2014 |
| JP | 2011022122 A | 2/2011 |
| WO | 2015057839 A1 | 4/2015 |

OTHER PUBLICATIONS

PCT/IB2017/053659 International Search Report and Written Opinion, dated Sep. 1, 2017.

(Continued)

*Primary Examiner* — Melissa J Koval
*Assistant Examiner* — Nasima Monsur
(74) *Attorney, Agent, or Firm* — Cantor Colburn LLP; Vazken Alexanian

(57) ABSTRACT

Techniques relate to reading a qubit coupled to a microwave resonator. A microwave signal at a microwave resonator frequency is input to the microwave resonator that couples to the qubit. A microwave readout signal from the microwave resonator is output to a microwave to optical converter. The microwave readout signal includes a qubit state of the qubit. The microwave to optical converter is configured to convert the microwave readout signal to an optical signal. In response to the optical signal being output by the microwave to optical converter, it is determined that the qubit is in a predefined qubit state. In response to no optical signal being output by the microwave to optical converter, it is determined that the qubit is not in the predefined qubit state.

25 Claims, 9 Drawing Sheets

(56) References Cited

U.S. PATENT DOCUMENTS

| | | | |
|---|---|---|---|
| 5,946,438 | A | 8/1999 | Minot et al. |
| 7,242,821 | B2 | 7/2007 | Bull et al. |
| 7,359,580 | B2 | 4/2008 | Darcie et al. |
| 7,587,144 | B2 | 9/2009 | Ilchenko et al. |
| 7,889,992 | B1* | 2/2011 | DiVincenzo ......... G06N 99/002 398/115 |
| 8,013,316 | B2 | 9/2011 | Eleftheeriades |
| 8,242,799 | B2* | 8/2012 | Pesetski ............... G06N 99/002 326/1 |
| 2002/0136504 | A1 | 9/2002 | Bocha |
| 2005/0273306 | A1* | 12/2005 | Hilton .................... B82Y 10/00 703/11 |
| 2011/0253906 | A1 | 10/2011 | Solano et al. |
| 2014/0314419 | A1* | 10/2014 | Paik ....................... H04B 10/70 398/115 |

OTHER PUBLICATIONS

Andrews, R. W., et al.; "Bidirectional and Efficient Conversion Between Microwave and Optical Light"; arXiv:1310.5276v2; p. 1-17; Aug. 11, 2014.

Rueda, Alfredo, et al.; "Efficient Single Sideband Microwave to Optical Conversion Using an Electro-Optical Whispering Gallery Mode Resonator"; arXiv:1601.07261v1; p. 1-8; Jan. 27, 2016.

Strekalov, Dmitry V., et al; "Towards Microwave Photon Counting Via Frequency Up-Conversion"; 2008 33rd International Conference on Infrared, Millimeter and Terahertz Waves; IEEE; p. 1-2; 2008.

Bagci, T., et al.; "Optical Detection of Radio Waves Through a Nanomechanical Transducer"; Nature; vol. 507; p. 81-85; Mar. 6, 2014.

Bochmann, Joerg, et al.; "Nanomechanical Coupling Between Microwave and Optical Photons"; Nature Physics; vol. 9; p. 712-716; Nov. 2013.

Paik, Hanhee, et al.; "Integrated Microwave-To-Optical Single-Photon Transducer with Strain-Induced Electro-Optic Material"; U.S. Appl. No. 15/018,288, filed Feb. 8, 2016.

Savchenkov, Anatoliy; "Microwave-to-Optical Conversion in WGM Resonators"; NASA Tech Briefs; 1 page; Nov. 2008.

Tsang, Mankei; "Cavity Quantum Electro-Optics"; Physical Review A; vol. 81; p. 063837-1-063837-5; 2010.

Wallraff, A., et al; "Strong Coupling of a Single Photon to a Superconducting Qubit Using Circuit Quantum Electrodynamics"; Nature; vol. 43; p. 162-167; Sep. 9, 2004.

* cited by examiner

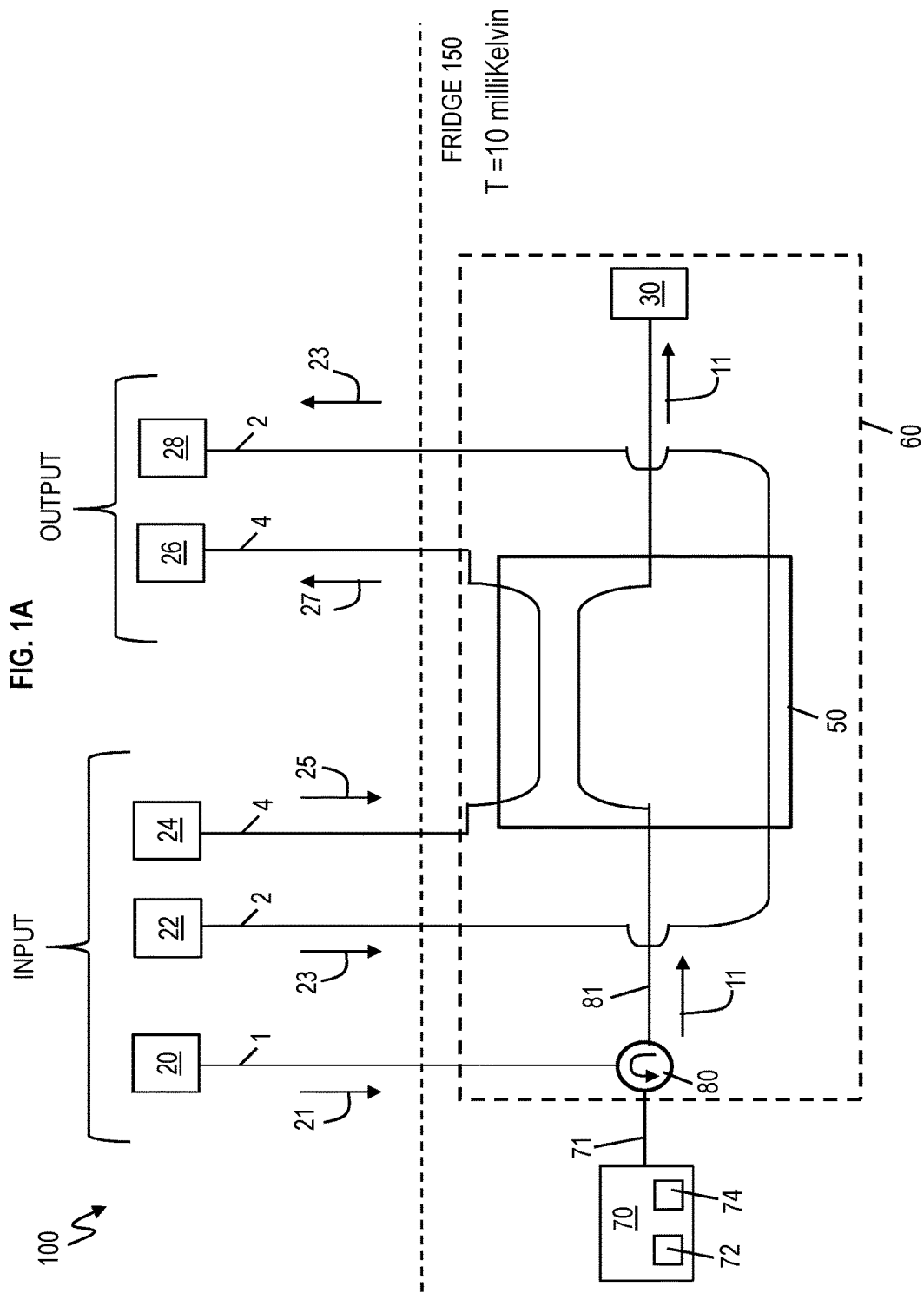

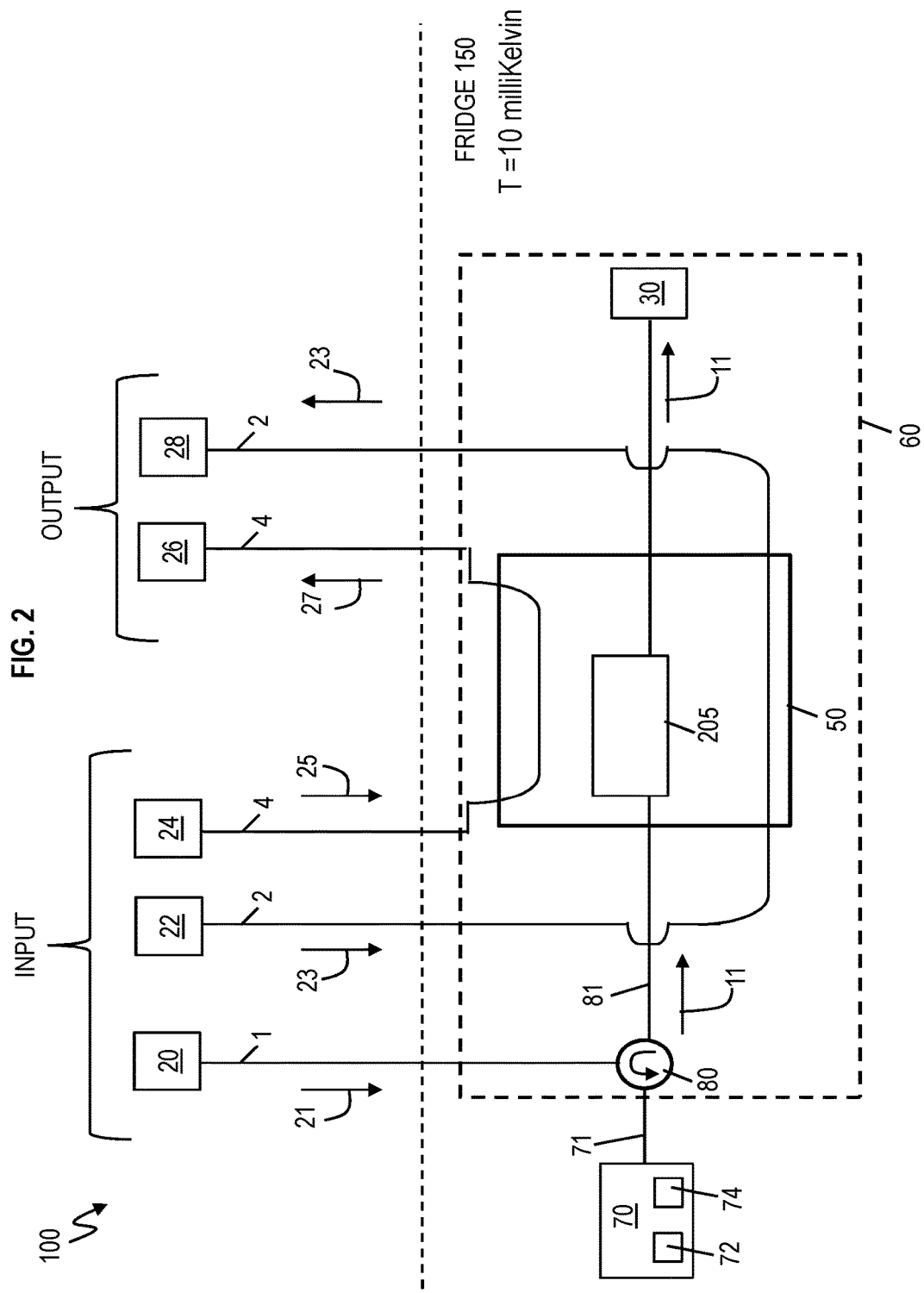

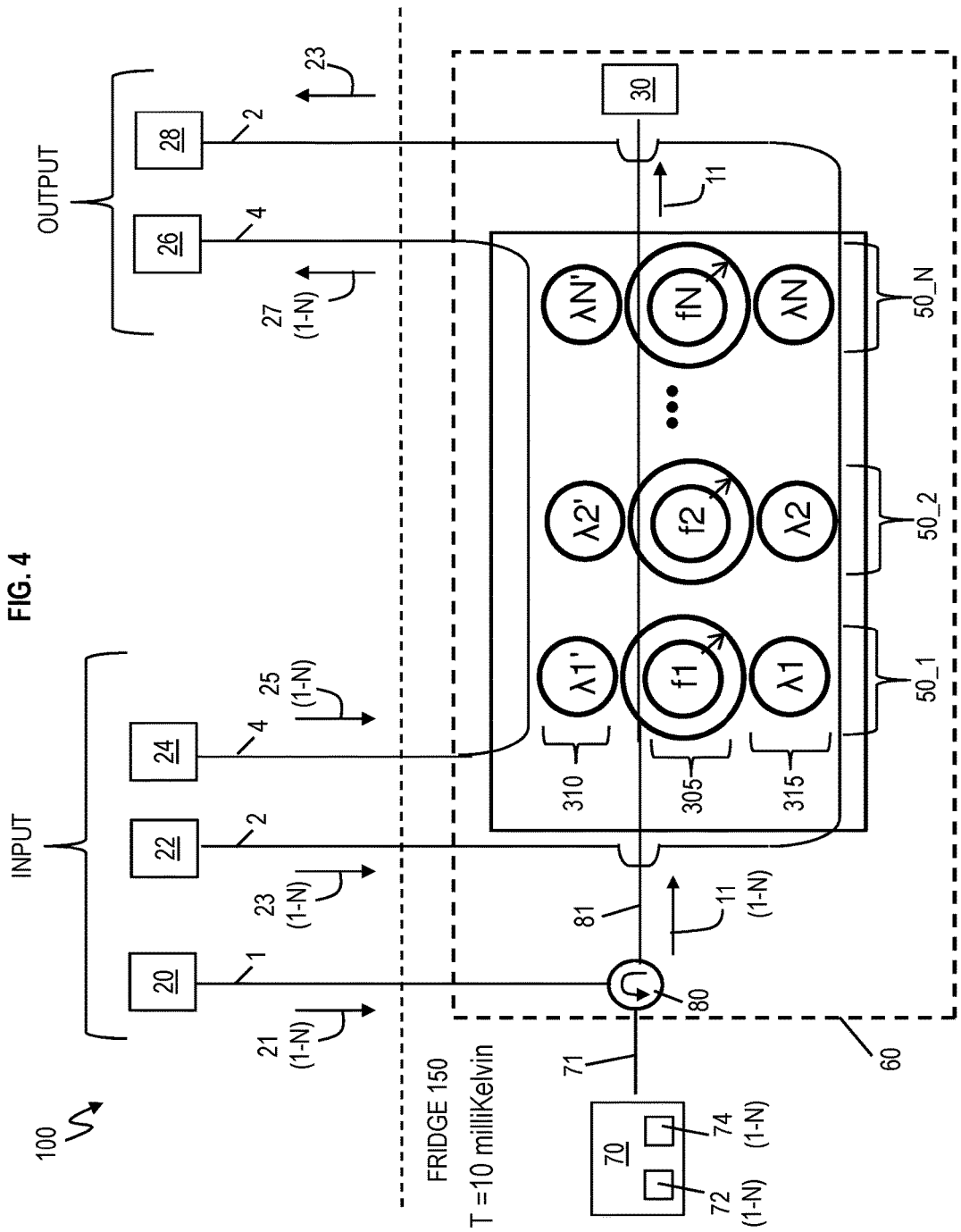

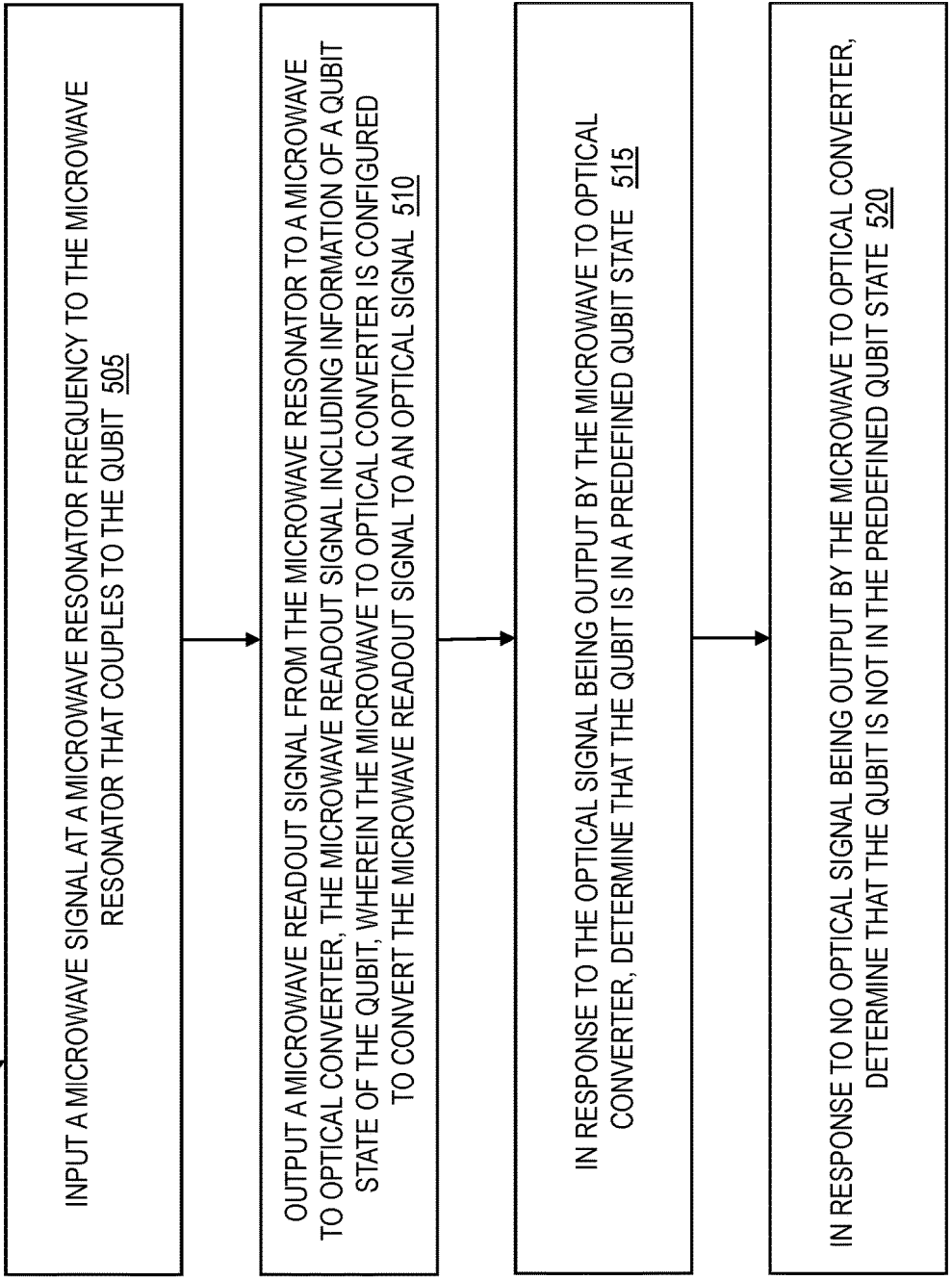

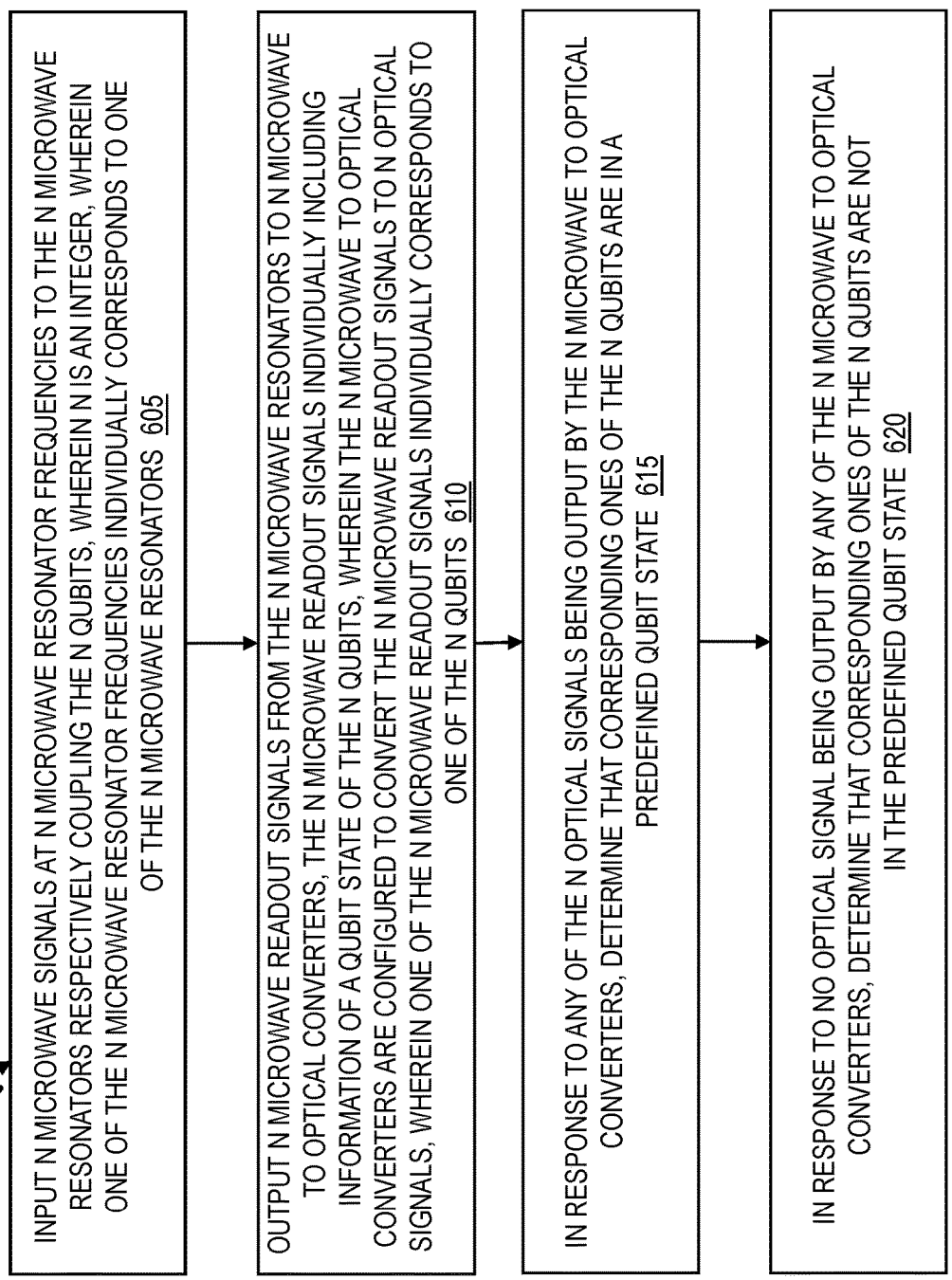

| | CONVENTIONAL MICROWAVE READOUT | READOUT USING MICROWAVE TO OPTICAL CONVERSION |
|---|---|---|
| 1 Hardware requirement per qubit | • 3 Isolators<br>• 2 circulators<br>• two amplifiers | • a microwave-optical conversion device (a chip)<br>• Single-photon detector |
| 2 Physical footprint per qubit setup | ~ 50000 cm$^3$ | ~ 100 cm$^3$ |
| 3 Scaling | Amount of required hardware increases proportional to the number of qubits | No increase in amount of hardware with multiplexed readout |
| 4 Requirement for good SNR | Low loss, low thermal noise | Conversion rate > Optical or Microwave cavity T$_1$ |

FIG. 8

|   |   | Conventional Readout | Conventional Multiplexing Readout | | Optical Readout With Multiplexing |
|---|---|---|---|---|---|
|   |   |   | Readout Cavity | Quantum Amplifiers / HEMT |   |
| 1 | Readout Drive Line | N | 1 | N / N | 1 |
| 2 | Isolators | 3N | 3 | 3 / 3N | 0 |
| 3 | Circulators | 2N | 2 | N+1 / 2N | 1 |
| 4 | Quantum Amplifiers | N | 1 | 1 / N | 0 |
| 5 | Pump Lines | N | 1 | 1 / N | 1 Optical |

800

READ OUT OF QUANTUM STATES OF MICROWAVE FREQUENCY QUBITS WITH OPTICAL FREQUENCY PHOTONS

BACKGROUND

The present invention relates to opto-electronic devices, and more specifically, to read out of quantum states of microwave frequency qubits with optical frequency photons.

In one approach called circuit quantum electrodynamics, quantum computing employs nonlinear superconducting devices called qubits to manipulate and store quantum information at microwave frequencies, and resonators (e.g., as a two-dimensional (2D) planar waveguide or as a three-dimensional (3D) microwave cavity) to read out and facilitate interaction among qubits. As one example, each superconducting qubit may comprise one or more Josephson junctions shunted by capacitors in parallel with the junctions. The qubits are capacitively coupled to 2D or 3D microwave cavities. The electromagnetic energy associated with the qubit is stored in the Josephson junctions and in the capacitive and inductive elements forming the qubit.

In one example, to read out the qubit state, a microwave signal is applied to the microwave readout cavity that couples to the qubit at the cavity frequency corresponding to the qubit state A. Transmitted (or reflected) microwave signal goes through multiple thermal isolation stages and low-noise amplifiers that are required to block or reduce the noise and improve the signal to noise ratio. The microwave signal is measured at room temperature. High microwave signal indicates that the qubit is in state A. Microwave readout provides a stable signal amplitude for control, and commercial off-the-shelf (COTS) hardware is available to use that covers most of microwave frequency ranges. However, microwave readout signal must be isolated from thermal noise and amplified with minimum noise added.

Quantum systems such as superconducting qubits are very sensitive to electromagnetic noise, in particular in the microwave and infrared domains. In order to protect these quantum systems from microwave and infrared noise, several layers of filtering, attenuation, and isolation are applied. Of particular interest are the layers of protection employed on the input and output (I/O) lines, also called transmission lines, that are connected to the quantum system, and carry the input and output signals to and from the quantum system respectively. In the case of superconducting qubits, these I/O lines (transmission lines) are usually microwave coaxial lines or waveguides. Some of the techniques or components that are used in order to block or attenuate the noise propagating or leaking into these transmission lines are attenuators, circulators, isolators, low-pass microwave filters, bandpass microwave filters, and infrared filters which are based on lossy absorptive materials. However, these noise isolation components and microwave signal amplification techniques require a large amount of additional microwave hardware and cost.

SUMMARY

According to one or more embodiments, a method of reading a qubit coupled to a microwave resonator is provided. The method includes inputting a microwave signal at a microwave resonator frequency to the microwave resonator that couples to the qubit, and outputting a microwave readout signal from the microwave resonator to a microwave to optical converter. Also, the microwave readout signal includes a qubit state of the qubit, and the microwave to optical converter is configured to convert the microwave readout signal to an optical signal. Further, the method includes in response to the optical signal being output by the microwave to optical converter, determining that the qubit is in a predefined qubit state, and in response to no optical signal being output by the microwave to optical converter, determining that the qubit is not in the predefined qubit state.

According to one or more embodiments, a method of reading N qubits respectively coupled to N microwave resonators is provided. The method includes inputting N microwave input readout signals at N microwave resonator frequencies to the N microwave resonators respectively coupling the N qubits, where N is an integer, and where one of the N microwave resonator frequencies individually corresponds to one of the N microwave resonators. The method includes outputting N microwave output readout signals from the N microwave resonators to N microwave to optical converters> The N microwave output readout signals individually include a qubit state of the N qubits. The N microwave to optical converters are configured to convert the N microwave output readout signals to N optical signals, and one of the N microwave output readout signals individually correspond to one of the N qubits. Also, the method includes in response to any of the N optical signals being output by the N microwave to optical converters, determining that corresponding ones of the N qubits are in a predefined qubit state, and in response to no optical signal being output by any of the N microwave to optical converters, determining that corresponding ones of the N qubits are not in the predefined qubit state.

According to one or more embodiments, a system for reading a qubit is provided. The system includes a microwave resonator coupled to the qubit. The microwave resonator is configured to receive a microwave signal at a microwave resonator frequency and output a microwave readout signal, and the microwave readout signal includes a qubit state of the qubit. The system includes a microwave to optical converter configured to receive the microwave readout signal from the microwave resonator. The microwave to optical converter is configured to convert the microwave readout signal to an optical signal, and the qubit is defined to be in a predefined qubit state when the optical signal is output by the microwave to optical converter. The qubit is defined to not be in the predefined qubit state when no optical signal is output by the microwave to optical converter.

According to one or more embodiments, a system for reading N qubits is provided. The system includes N microwave resonators coupled to the N qubits, and the N microwave resonators are configured to receive N microwave input readout signals at N microwave resonator frequencies and output N microwave output readout signals, where N is an integer. N microwave to optical converters are configured to receive the N microwave output readout signals from the N microwave resonators, and the N microwave output readout signals individually include a qubit state of the N qubits. The N microwave to optical converters are configured to convert the N microwave output readout signals to N optical signals. One of the N microwave output readout signals individually corresponds to one of the N qubits, and ones of the N qubits are respectively defined to be in a predefined qubit state when corresponding ones of the N optical signals are output by corresponding ones of the N microwave to optical converters. Corresponding ones of the N qubits are defined to not be in the predefined qubit state when no corresponding ones of the N optical signals are output by corresponding ones of the N microwave to optical converters.

According to one or more embodiments, a readout system for reading one or more qubits is provided. The readout system includes one or more microwave waveguides, one or more optical waveguides, and one or more microwave to optical converters configured to receive one or more microwave readout signals corresponding to the one or more qubits via the one or more waveguides. The one or more microwave to optical converters are configured to output one or more optical signals for the one or more qubits being in a predefined qubit state via the one or more optical waveguides. The one or more microwave to optical converters are configured to output no optical signals for the one or more qubits not being in the predefined qubit state.

BRIEF DESCRIPTION OF THE DRAWINGS

FIG. 1A is a schematic of an architecture/microwave and optical apparatus (qubit readout system) for measurement of a quantum system according to one or more embodiments.

FIG. 2 is a schematic of an architecture/microwave and optical apparatus for measurement of a quantum system according to one or more embodiments.

FIG. 4 is a schematic of an architecture/microwave and optical apparatus for measurement of a quantum system according to one or more embodiments.

FIG. 5 is a flow chart of a method of reading a qubit coupled to a microwave readout resonator according to one or more embodiments.

FIG. 6 is a flow chart of method of reading N qubits respectively coupled to N microwave readout resonators according to one or more embodiments.

FIG. 7 is a chart illustrating conventional readout per qubit versus readout using microwave to optical conversion per qubit according to one or more embodiments.

FIG. 8 is a chart illustrating comparison of the hardware requirement for N qubit readout according to one or more embodiments.

DETAILED DESCRIPTION

Figure 1B:
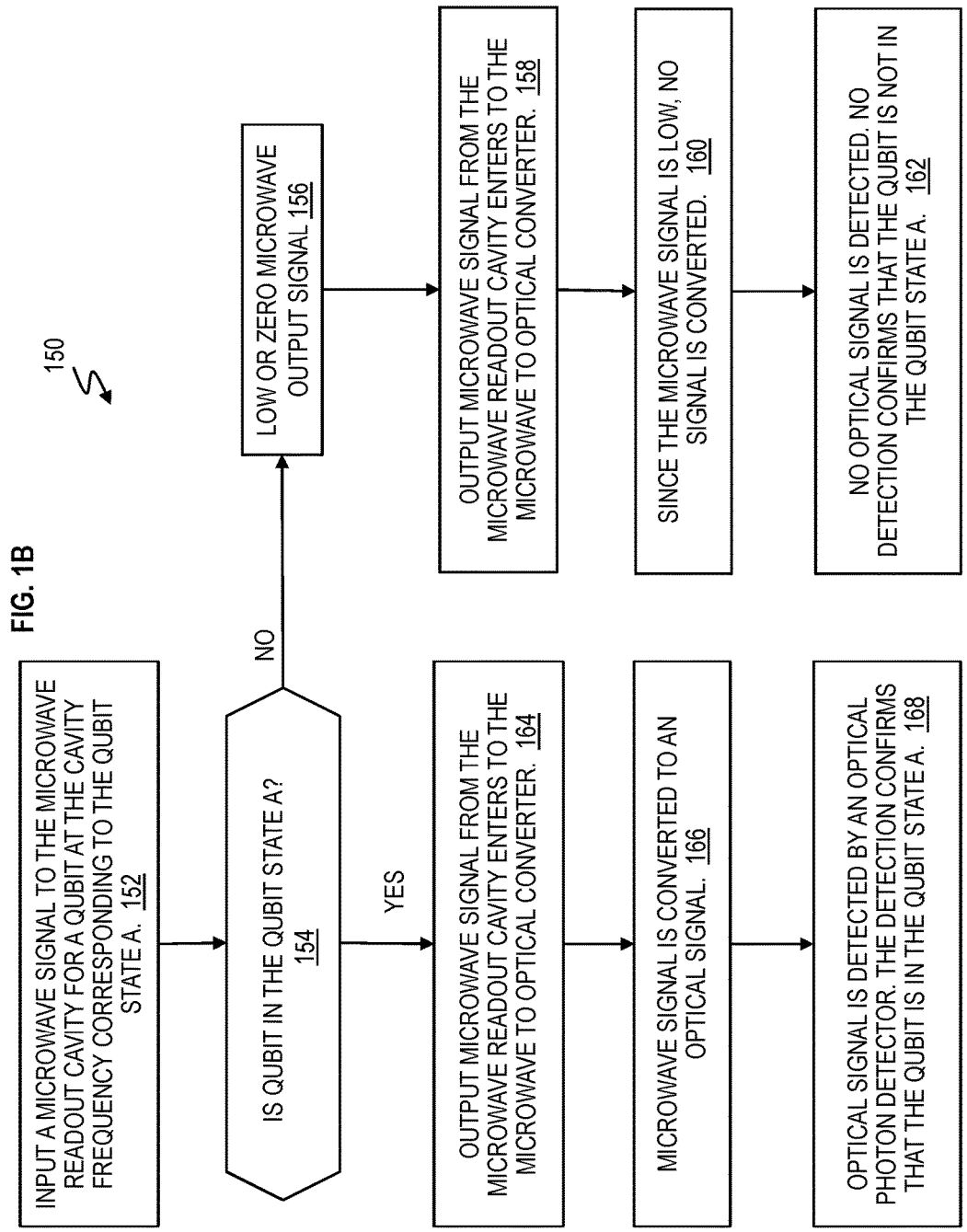
FIG. 1B is a flow chart depicting an example operation of the readout architecture/microwave and optical apparatus according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

One or more embodiments include devices and methods to read out a quantum state of qubits by converting the microwave readout signal to optical photons. The examiner at room temperature measures (via a photon measurement device) the qubit state by receiving the optical photons with the information on the qubit state via optical fiber.

In a state-of-the-art system, the typical microwave control and readout setup is discussed. A typical hardware overhead for readout of a single qubit requires 3 isolators, 1 to 2 circulators, 2 amplifiers, coaxial cables, and good thermalization of all components. The volume per qubit (volume/qubit) is about 0.001 meters cubed ($m^3$) and the weight per qubit (weight/qubit) is about 1 kilogram (kg). The state-of-the-art readout setup is not scalable, such as, for example, not scalable to 100 qubits as the entire readout setup for 100 qubits does not fit into a current state-of-art dilution refrigerator. The state-of-the-art microwave readout requires a lot of hardware: a large footprint, large mass, and large thermal mass.

Embodiments provide a smaller and lighter readout system that the output chain with optical fibers does not have a large thermal mass. One or more embodiments provide a scalable solution for 100 qubits or more. Multiplexing may be utilized for N (N>1 is an integer) amount of qubits in one or more embodiments.

Now turning to the figures, FIG. 1A is a schematic of an architecture/microwave and optical apparatus 100 (qubit readout system) and illustrates measurement of a quantum system according to one or more embodiments. FIG. 1A illustrates measurement of the quantum system in reflection but it should be appreciated that the measurement may be made when the quantum system works in transmission. When the readout resonator works in transmission, the input and output signals do not share the same transmission line, and without loss of generality the input signal enters on one transmission line and the output signal exits another transmission line. When the readout resonator works in reflection, both the input and output signals share the same transmission line as depicted in FIG. 1A.

The readout architecture/microwave and optical apparatus 100 is for microwave qubit readout using a microwave to optical conversion. The architecture/microwave and optical apparatus 100 utilizes a microwave to optical converter 50 in a microwave qubit readout device 60.

The readout architecture/microwave and optical apparatus 100 includes a quantum system 70 which is a microwave qubit 72 and a microwave readout resonator 74. In one example, the quantum system 70 may be a superconducting quantum system and the microwave qubit 72 may be a superconducting qubit. In one example, the microwave readout resonator 74 may be implemented as a two-dimensional (2D) microwave cavity or a three-dimensional (3D) microwave cavity.

The microwave readout resonator 74 is designed to read (i.e., probe) the state of the microwave qubit 72. In one implementation, the microwave qubit 72 may be a superconducting transmon qubit that includes a Josephson junction. In one implementation, the microwave qubit 72 may be capacitively coupled to the microwave readout resonator 74. There are various designs for microwave readout resonators. Examples of the microwave readout resonator 74 may include an inductor and capacitor, coplanar waveguide resonator, coplanar strip line resonator, lumped-element resonator, 3D waveguide cavity, and/or cylindrical cavity. Note that although the microwave qubit 72 may be a transmon qubit circuit for explanation purposes, it is understood that the microwave qubit 72 is not meant to be limited and applies to other superconducting qubits circuits that are not transmon qubit circuits.

Although one qubit 72 and one readout resonator 74 are depicted in this example, the quantum system 70 may include/represent one or more qubits 72 and one or more microwave readout resonator 74, where each qubit 72 is coupled to its own microwave readout resonator 74.

The readout device 60 includes a microwave circulator 80, the microwave to optical converter 50, and a termination point 30. The readout system 100 includes transmission lines as microwave waveguides 1, 71, and 81 and optical waveguides 2 and 4 on the input and output side of the microwave to optical converter 50. The readout device 60 and the quantum system 70 are both in a refrigerator 150 that cools to a predefined temperature for a low thermal noise and, if necessary, superconductivity. The elements below the dashed line are maintained as the predefined temperature including waveguides (i.e., transmission lines). In one implementation, the fridge 150 may maintain the temperature at the predefined temperature of about 10 millikelvin (mK), which is the typical temperature utilized to suppress thermal excitation and noise. The fridge 150 may be a dilution fridge that maintains the readout device 60, quantum system 70, and associated waveguides at the 10 mK stage. The readout device 60 may be made of superconducting materials that operate according to the principles of superconductivity when cooled to the predefined temperature. Also, the quantum system 70 may be made of superconducting materials.

The microwave circulator 80 is connected to the quantum system 70 via transmission line 1. A microwave signal generator 20 transmits an input microwave signal 21 to the circulator 80 via transmission line 1.

The input microwave signal 21 is input into/received by one port of the circulator 80, and the input microwave signal 21 is output through the next port after rotating counter clockwise (i.e., in the direction of the arrow). The circulator 80 is illustrated with three ports. This example shows the circulator 80 with the first port connected to the input/output of the quantum system 70. The second port of the circulator 80 is connected to the microwave input of the microwave to optical converter 50. The third port of the circulator 80 is connected to the microwave signal generator 20.

The microwave signal generator 20 (or another signal generator (not shown) connected to the microwave qubit) is configured to generate a microwave signal (not shown) at the qubit resonant frequency ($f_q$) of the microwave qubit 72, and this qubit signal ($f_q$) is input into the quantum system 70. The input qubit resonant frequency signal initializes, manipulates, excites, or controls the qubit 72. Each qubit state produces a unique readout resonator resonance. To measure or infer the state of the superconducting qubit 72, an input readout signal 21 is generated by the microwave signal generator 20 or a different generator at the readout resonant frequency ($f_r$) of the readout resonator 74. The input readout signal 21 is sent to the quantum system 70. The input readout signal 21 is input into the readout resonator 74 at resonance (or close to resonance of the readout resonator 74) via the circulator 80, such that the readout resonator 74 is excited. The readout resonator 74 generates (or resonates) an output readout signal 11 at the readout resonant frequency ($f_r$). The output readout signal 11 leaving the readout resonator 74, after interacting dispersively with the qubit 72, carries (quantum) information about the qubit 72 state, i.e., whether the qubit 72 is in the ground state, excited state, and/or in a superposition of these two states. This qubit information is encoded in either the phase and/or amplitude of the output microwave readout signal 11. The output readout signal 11 is the resonator readout signal that is output from the readout resonator 74 on transmission line 71 to circulator 80 and then to the microwave to optical converter 50 on transmission line 81. The circulator 80 is designed to (rotationally) direct the resonator output readout signal 11 to the microwave to optical converter 50. The resonator output readout signal 11 is a microwave signal at (or close to) the readout resonant frequency ($f_r$) of the readout resonator 74.

Concurrently, an optical signal generator 22 (e.g., optical pump) is configured to generate an optical pump signal 23 at an optical pump frequency ($f_p$). The optical signal generator 22 transmits the optical pump signal 23 on transmission line 2 to the microwave to optical converter 50. Concurrently, an optical signal generator 24 is configured to generate an input optical signal 25 at an input optical signal frequency (G). The optical signal generator 24 transmits the input optical signal 25 to the microwave to optical converter 50.

The microwave to optical converter 50 is configured to (concurrently) receive the output readout signal 11 having the qubit state of the qubit 72, and the optical pump signal 23. The input optical signal 25 is optional, which can be used to characterize or bias the microwave to optical converter 50. The microwave to optical converter 50 converts the output microwave readout signal 11 at frequency $f_{oo}$ to an output optical signal 27. The output optical signal 27 is transmitted from the microwave to optical converter 50 to an optical photon detector 26 via transmission line 4 (on the output side). The output optical signal 27 contains the information of the qubit state of the qubit 72, and the optical photon detector 26 is configured to read/extract the qubit state by detecting an optical photon in the output optical signal 27. The optical photon detector 26 can be cooled to a cryogenic temperature, for example, 4 kelvin (i.e., located at the 4 K stage).

The remainder optical pump signal 23 is dumped to an optical dump 28. An optical dump or beam dump is a device designed to absorb the energy of photons or other particles within an energetic beam. The remainder output readout signal 11 is terminated at the termination point 30. The termination point 30 may be a 50 Ohm load, and the termination point is cooled to the predefined temperature, e.g., 10 mK. In one implementation, the termination point 30 may be a resistor.

According to embodiments, inside the microwave to optical conversion device 50, a microwave output readout signal 11 that contains the information of the qubit state, is converted to an optical signal (e.g., frequency is equal to approximately ($\approx$) 193 terahertz (THz)) using the power from the optical pump signal 23. It is noted that the optical pump frequency ($f_p$)=output microwave signal frequency ($f_r$)+output optical signal frequency converted from the microwave signal ($f_{oo}$).

FIG. 1B is a flow chart 150 depicting an example operation of the readout architecture/microwave and optical apparatus 100 according to one or more embodiments. In this example, qubit state A (interchangeably referred to as quantum state A) may correspond to the excited state.

At block 152, a microwave input readout signal 21 is input to the readout resonator 74 such that the readout resonator 74 outputs the microwave output readout signal 11 containing the information of the qubit state of the qubit 72. In one implementation, the microwave input signal 21 is at the readout resonator frequency ($f_r$).

At decision block 154, the flow can have two different operations according to whether the qubit 72 is in the qubit state A or not. If "no" the qubit 72 is not in the qubit state A, then the microwave output readout signal 11 is zero or low at block 156. A low microwave output readout signal 11 is defined as a predefined value that is below a predefined threshold for the microwave to optical converter 50 to convert to an optical signal. In one implementation, a low microwave output readout signal 11 is too small for the microwave to optical converter 50 to recognize and/or utilize for optical conversion.

At block 158, the microwave output readout signal 11 from the readout resonator 74 enters the microwave to optical converter 50. Since the microwave output readout signal 11 is low (or below a predefined threshold), no microwave signal is converted by the microwave to optical converter 50 at block 160. Accordingly, at block 162, no optical signal is detected by the photon detector 26, and therefore, no detection (by the photon detector 26) confirms that the qubit 72 is not in the qubit state A.

Alternatively, at decision block 154, the flow branches to block 164 because "yes" the qubit 72 is in the qubit state A. At block 164, the microwave output readout signal 11 from the readout resonator 74 enters the microwave to optical converter 50.

At block 166, the microwave to optical converter 50 converts the microwave output readout signal 11 to the output optical signal 27 that contains the qubit state.

At block 168, the output optical signal 27 is detected by the optical photon detector 26, and this detection (of at least one optical photon) of the output optical signal 27 by the optical photon detector 26 confirms that the qubit 72 is in state A. In one implementation, the qubit state is contained in the photon number or optical power (and not necessarily in the phase nor amplitude). Whether the optical signal is detected (i.e., yes in state A) or not detected determines that the qubit 72 is in state A or not.

FIG. 2 is a schematic of an architecture/microwave and optical apparatus 100 (qubit readout system) and illustrates measurement of a quantum system according to one or more embodiments. Identical elements are included in FIG. 1 and FIG. 2, and their description is not repeated but has been previously discussed herein.

FIG. 2 includes the microwave to optical converter 50 and provides more details. In this example, the microwave to optical converter 50 is represented as an optical mechanical microwave to optical conversion device. The optical mechanical microwave to optical conversion device 50 includes a piezo optical mechanical oscillator/resonator 205. The piezo optical mechanical oscillator 205 includes piezo material that oscillates (i.e., moves) based on the microwave output readout signal 11 in conjunction with the optical pump signal 23 and the input optical signal 25. The optical mechanical microwave to optical conversion device 50 converts the microwave output readout signal 11 to the output optical signal 27 for detection by the optical photon detector 26. In one implementation, the optical mechanical oscillator does not have to be a piezoelectric. In one implementation, the optical mechanical oscillator can be a photonic crystal optical beam cavity or a dielectric membrane opto-mechanical cavity.

For example, the microwave output readout signal 11 that contains the information of the qubit state is converted to an output optical signal 27 (as optical frequency of approximately (≈) 193 terahertz (THz)) using the power from the optical pump signal 23 in the opto-mechanical microwave to optical conversion device 50. In the opto-mechanical micro-wave to optical conversion device 50, the microwave output readout signal 11 modulates the optical frequency by mechanically vibrating the optical resonator 205, and is converted into output optical signal 27 using optical pump signal 23 from the optical pump 22.

Figure 3:
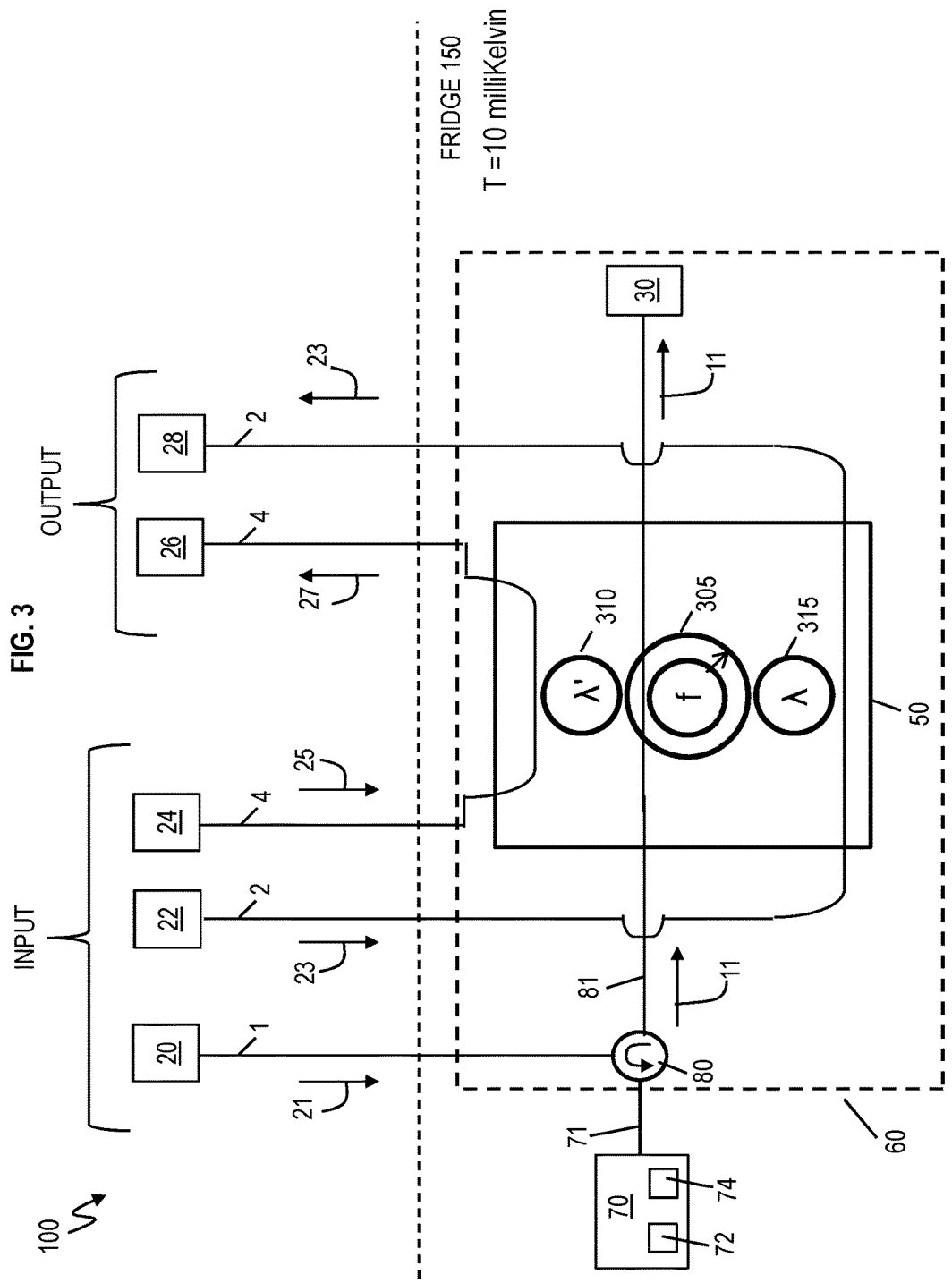
FIG. 3 is a schematic of an architecture/microwave and optical apparatus for measurement of a quantum system according to one or more embodiments.

FIG. 3 is a schematic of an architecture/microwave and optical apparatus 100 (qubit readout system) and illustrates measurement of a quantum system according to one or more embodiments. Identical elements are included FIG. 1 and FIG. 3, and their description is not repeated but has been previously discussed herein.

FIG. 3 provides further details of the microwave to optical converter 50. In this example, the microwave to optical converter 50 is represented as an electro-optic microwave to optical converter. The electro-optic microwave to optical converter 50 includes optical readout coupling resonator 310 ($\lambda'$), electro-optic device 305 (f), and optical pump coupling resonator 315 ($\lambda$). The optical readout coupling resonator 310 ($\lambda'$) couples to the electrical optical device 305 (f), and the optical pump coupling resonator 315 ($\lambda$) also couples to the electrical optical device 305 (f).

In this example, the optical readout coupling resonator 310 ($\lambda'$) has a wavelength $\lambda'$ that corresponds to (or matches) the output optical frequency $f_{oo}$ of output optical signal 27. The electrical optical device 305 (f) has a free-spectral range frequency (f) that corresponds to (or matches) the readout resonator frequency $f_r$ of the microwave output readout signal 11. Also, the optical pump coupling resonator 315 ($\lambda$) has a wavelength $\lambda$ that corresponds to (or matches) the pump frequency $f_p$ of optical pump signal 23. The electro-optic device 305 contains a microwave resonator at f and an optical resonator made with an electro-optic material, whose optical resonance frequency changes when a microwave photon is applied from the microwave resonator f.

For example, the microwave output readout signal 11 that contains the information of the qubit state is converted to an output optical signal 27 (e.g., frequency≈193 THz) using the power from the optical pump signal 23 in the electro-optic microwave to optical conversion device 50. The electro-optic microwave to optical conversion device 50 uses the electro-optic effect for the conversion, which allows the microwave signal to modulate the optical frequency. When the optical pump signal 23 and the microwave signal 11 enters the electro-optic device 305, the microwave output readout signal 11 is converted to the output optical signal 27.

FIG. 4 is a schematic of an architecture/microwave and optical apparatus 100 (qubit readout system) and illustrates measurement of a quantum system according to one or more embodiments. In FIG. 4, the readout system 100 is configured for multiplexed readout of multiple qubits. Identical elements are included in FIG. 1, FIG. 3, and FIG. 4, and their description is not repeated but has been previously discussed herein.

FIG. 4 includes multiple electro-optic microwave to optical converters 50_1 to 50_N, each respectively including its own optical readout coupling resonator 310 ($\lambda 1'$-$\lambda N'$), its own electro-optic device 305 (f1-fN), and its own optical pump coupling resonator 315 ($\lambda 1$-$\lambda N$). Each respective optical readout coupling resonator 310 ($\lambda 1'$-$\lambda N'$) couples to its respective electro-optic device 305 (f1-fN), and each optical pump coupling resonator 315 ($\lambda 1$-$\lambda N$) also couples to its own electro-optic device 305 (f1-fN). N is an integer representing the last number of the particular element.

In this example, the optical readout coupling resonators 310 ($\lambda 1'$-$\lambda N'$) have a wavelength $\lambda 1'$-$\lambda N'$ (or frequencies) that respectively correspond to (or match) the output optical frequencies $f_{oo1}$-$f_{ooN}$ of output optical signal 27. Each individual optical readout coupling resonator 310 emits light of the output optical signal 27 after the input microwave signals 11 are converted to the output optical signals 27 using the pump 23. The readout resonator frequencies $f_{r1}$-$f_{rN}$ of the microwave output readout signals 11 are multiplexed and transmitted to respective electro-optic devices 305 (f1-f2) on the microwave waveguide 71, 81. Accordingly, the electro-optic devices 305 (f1-f2) have frequencies (f1-f2) that correspond to (or match) the readout resonator frequency $f_{r1}$-$f_{rN}$ of the microwave output readout signals 11.

Also, there are multiple pump frequencies $f_{p1}$-$f_{pN}$ of the optical pump signals 23. Accordingly, the optical pump coupling resonators 315 (λ1-λN) respectively have wavelengths λ1-λN (or frequencies) that correspond to (or match) the pump frequency $f_{p1}$-$f_{pN}$ of optical pump signals 23.

The microwave quantum system 70 includes N-qubits 72 and N-microwave readout resonators 74. Each of the N-qubits 72 couples to its own one of N-microwave readout resonators 74. Each individual one of the N-microwave readout resonators 74 is designed to read (i.e., probe) the state of its respective one of the N-qubits 72. One of the N-qubits 72 is operatively coupled to one of the N-readout resonators 74.

Multiple multiplexed microwave output readout signals 11 that contain information of multiple qubit states respectively for each of the N-qubits 72 enter the microwave-to-optical conversion devices 50_1-50_N. Each microwave-to-optical conversion device 50_1-50_N has a slightly different frequency (f1-fN) designed to selectively convert each microwave output readout signal 11 (having a respective frequency $f_{r1}$-$f_{rN}$) from each of the N-qubits 72. This setup allows reading out of multiple qubit states at the same time for each of the N-qubits 72 by converting the respective multiplexed microwave output readout signals 11 (having a respective readout frequencies $f_{r1}$-$f_{rN}$) into a multiplexed output optical signal 27 on optical waveguide 4 and N photon detectors (output side) via respective microwave to optical converters 50_1-50_N. It should be appreciated that each designation 1-N is meant to be associated each corresponding element, signal, frequency, wavelength, device, etc.

FIG. 5 is a flow chart 500 of a method of reading a qubit 72 coupled to a microwave readout resonator 74 according to one or more embodiments. Reference can be made to FIGS. 1A, 1B, 2, 3, 4, 7, and/or 8.

At block 505, a microwave input readout signal 21 at a microwave resonator frequency is input to the microwave readout resonator 74 that couples to the qubit 72.

At block 510, a microwave readout signal 11 is output from the microwave readout resonator 74 to a microwave to optical converter 50, and the microwave readout signal 11 includes information of a qubit state of the qubit 72, where the microwave to optical converter 50 is configured to convert the microwave readout signal to an optical signal.

At block 515, in response to the optical signal 27 being output by the microwave to optical converter 50, it is determined that the qubit 72 is in a predefined qubit state. At block 520, in response to no optical signal being output by the microwave to optical converter 50, it is determined that the qubit 72 is not in the predefined qubit state.

Determining that the qubit 72 is in the predefined qubit state comprises converting, by the microwave to optical converter 50, the microwave readout signal 11 to the optical signal 27. The microwave to optical converter 50 is configured to output the optical signal 27.

A photon detector 26 detects (at least one optical photon in) the optical signal 27 from the microwave to optical converter 50. Detecting of the optical signal by the photon detector 26 is utilized to determine that the qubit is in the predefined qubit state. In response to a photon detector 26 detecting no optical signal output from the microwave to optical converter 50, the detecting of no optical signal is utilized to determine that the qubit 72 is not in the predefined qubit state. No optical signal is detected by the photon detector because the microwave readout signal 11 is below a threshold for the microwave to optical converter 50, thereby causing the microwave to optical converter to output no optical signal.

In one implementation, an operator reading the photon detector 26 makes the determination in blocks 525 and 530. In one implementation, a computer having a processor, computer implemented instructions, and memory may be connected to the photon detector 26, and the computer is configured to recognize detection of the optical signal 27 by the photon detector 26, such that the computer can make the determination in blocks 525 and 530.

The microwave to optical converter 50 is a device selected from a group consisting of an electro-optic device (FIGS. 3 and 4), an opto-mechanical device (FIG. 1), an opto-piezo-electric device (FIG. 2), a magneto-optic device, or any device that can convert a quantum microwave signal to optical signal.

The microwave readout resonator 74 is a microwave cavity (e.g., a 1D, 2D or 3D microwave readout cavity).

The microwave resonator 74, the qubit 72, and the microwave to optical converter 50 are cooled to a predefined temperature, which is much lower than thermal noise temperature.

FIG. 6 is a flow chart 600 of method of reading N qubits 72 respectively coupled to N microwave resonators 74 (e.g., 1 through N microwave readout resonators) according to one or more embodiments. Reference can be made to FIGS. 1A, 1B, 2, 3, 4, 5, 7, and/or 8.

At block 605, N microwave input readout signals 21 at N different microwave resonator frequencies are input to the N microwave readout resonators 74 respectively coupling the N qubits 72, where N is an integer, where each one of the N microwave resonator frequencies individually corresponds to one of the N microwave resonators 74. The N different microwave resonator frequencies correspond to the N microwave resonators 74 on a one-to-one basis.

At block 610, N microwave readout signals 11 (e.g., 1 through N microwave readout signals may be multiplexed on the waveguides 71 and 81) are respectively output from the N microwave resonators 74 to N microwave to optical converters 50_1-50_N, and the N microwave readout signals 11 individually include information of a qubit state of each the N qubits, where the N microwave to optical converters 50 are configured to convert the N microwave readout signals 11 to N optical signals 27 (e.g., 1 though N optical signal on optical waveguide 4). One of the N microwave readout signals 11 individually corresponds to one of the N qubits 72.

At block 615, in response to any of the N optical signals 27 being output by the N microwave to optical converters 50_1-50_N, it is determined that corresponding ones of the N qubits 72 are in a predefined qubit state.

At block 620, in response to no optical signal being output by anyone of the N microwave to optical converters 50_1-50_N, it is determined that corresponding ones of the N qubits 72 are not in the predefined qubit state.

The N microwave to optical converters 50_1-50_N are configured to multiplex the N output optical signals 27 into multiple-optical signal output on an optical line 4, going to N photon detectors.

One or more microwave waveguides 71, 81 couple to the microwave to optical converter 50 to the microwave resonator 74. One or more optical waveguides 2, 4, couple to the microwave to optical converter 50. One or more microwave circulators 80 connects the microwave resonator 74 and the microwave to optical converter 50.

It should be appreciated that the readout device 70 and/or any device in the readout device 70 may be implemented on a chip, for example, as an integrated circuit. It should be appreciated that the microwave to optical converter 50 and/or any device in the microwave to optical converter 50 may be implemented on a chip, for example, as an integrated circuit.

For illustration purposes and not limitation, tables are shown in FIGS. 7 and 8 to assist the reader in understanding the reduction in hardware overhead and reduction in hardware requirement according to one or more embodiments.

FIG. 7 is a chart 700 illustrating conventional readout per qubit versus readout using microwave to optical conversion per qubit according to one or more embodiments. Chart 700 illustrates 4 rows entitled hardware requirement, physical footprint per qubit setup, scaling, and requirement for good signal-to-noise ratio (SNR).

For reading each qubit, the conventional microwave readout has a larger hardware requirement than the optical readout using microwave to optical conversion of embodiments.

FIG. 8 is a chart 800 illustrating comparison of the hardware requirement for N qubit readout according to one or more embodiments. Chart 800 illustrates 5 rows entitled readout drive line, isolators, circulators, quantum amplifiers, and pump lines.

Chart 8 shows a comparison between a convention readout, conventional multiplexing readout, and optical readout with multiplexing according to one or more embodiments. For reading N qubit readout (where N is an integer), the optical readout with multiplexing for N qubits in embodiments requires fewer hardware devices than conventional readout or conventional multiplexing readout.

Technical effects and benefits include improved qubit readout systems and methods, by utilizing, for example, one or more microwave to optical converters. Technical benefits provide a novel structure and method that read out a quantum state of qubits, whose signal is at microwave frequency, using optical photons via optical fiber. Further, embodiments provide a significant reduction in the amount of heavy microwave components, thus allowing the scale up of microwave qubits with less hardware requirements as compared to the state-of-the-art. Additionally, embodiments disclose the readout of quantum states of microwave qubits in a much more thermally and electrically isolated environment with readout cables terminated at cold stages.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of reading a qubit coupled to a microwave resonator, the method comprising:
   in response to a microwave signal at a microwave resonator frequency being input to the microwave resonator that couples to the qubit, outputting a microwave readout signal from the microwave resonator to a microwave to optical converter, the microwave readout signal including a qubit state of the qubit, wherein the microwave to optical converter is configured to convert the microwave readout signal to an optical signal, wherein a photon detector is coupled to an output optical waveguide of the microwave to optical converter, the microwave to optical converter being a separate device from the photon detector;
   in response to the optical signal being output by the microwave to optical converter, determining that the qubit is in a predefined qubit state by the photon detector detecting the optical signal from the microwave to optical converter; and
   in response to no optical signal being output by the microwave to optical converter, determining that the qubit is not in the predefined qubit state by the photon detector failing to detect the optical signal from the microwave to optical converter.

2. The method of claim 1, wherein determining that the qubit is in the predefined qubit state comprises converting, by the microwave to optical converter, the microwave readout signal to the optical signal.

3. The method of claim 2, further comprising outputting, by the microwave to optical converter, the optical signal.

4. The method of claim 1, wherein a circulator is configured to receive the microwave readout signal from the microwave resonator and transfer the microwave readout signal to the microwave to optical converter, the circulator transferring in one direction.

5. The method of claim 1, wherein detecting of the optical signal by the photon detector is utilized to determine that the qubit is in the predefined qubit state.

6. The method of claim 1, wherein in response to a photon detector detecting no optical signal output from the microwave to optical converter, the detecting of no optical signal is utilized to determine that the qubit is not in the predefined qubit state.

7. The method of claim 6, wherein no optical signal is detected by the photon detector because the microwave readout signal is below a threshold for the microwave to optical converter, thereby causing the microwave to optical converter to output no optical signal.

8. The method of claim 1, wherein the microwave to optical converter is a device selected from a group consisting of an electro-optic device, an opto-mechanical device, an opto-piezo-electric device, and a magneto-optic device.

9. The method of claim 1, wherein the microwave resonator is a microwave cavity.

10. The method of claim 1, wherein the microwave resonator, the qubit, and the microwave to optical converter are cooled to a predefined temperature.

11. The method of claim 10, wherein the predefined temperature ranges from about 0.01 to 0.1 kelvin.

12. A method of reading N qubits respectively coupled to N microwave resonators, the method comprising:
inputting N microwave input readout signals at N microwave resonator frequencies to the N microwave resonators respectively coupling the N qubits, wherein N is an integer, wherein one of the N microwave resonator frequencies individually corresponds to one of the N microwave resonators;
outputting N microwave output readout signals from the N microwave resonators to N microwave to optical converters, the N microwave output readout signals individually including a qubit state of the N qubits, wherein the N microwave to optical converters are configured to convert the N microwave output readout signals to N optical signals, wherein one of the N microwave output readout signals individually corresponds to one of the N qubits, wherein a photon detector is coupled to an output optical waveguide of the N microwave to optical converters, the N microwave to optical converters being separate devices from the photon detector;
in response to any of the N optical signals being output by the N microwave to optical converters, determining that corresponding ones of the N qubits are in a predefined qubit state by the photon detector detecting the optical signal from the microwave to optical converter; and
in response to no optical signal being output by any of the N microwave to optical converters, determining that corresponding ones of the N qubits are not in the predefined qubit state by the photon detector failing to detect the optical signal from the microwave to optical converter.

13. The method of claim 12, wherein the N microwave to optical converters are configured to multiplex the N optical signals into a single optical signal output on an optical line.

14. A system for reading a qubit, the system comprising:
a microwave resonator coupled to the qubit, the microwave resonator configured to receive a microwave signal at a microwave resonator frequency and output a microwave readout signal, wherein the microwave readout signal includes a qubit state of the qubit; and
a microwave to optical converter configured to receive the microwave readout signal from the microwave resonator, the microwave to optical converter configured to convert the microwave readout signal to an optical signal, wherein a photon detector is coupled to an output optical waveguide of the microwave to optical converter, the microwave to optical converter being a separate device from the photon detector, wherein the qubit is defined to be in a predefined qubit state when the optical signal is detected by the photon detector as being output by the microwave to optical converter, wherein the qubit is defined to not be in the predefined qubit state when no optical signal is output by the microwave to optical converter.

15. The system of claim 14, further comprising one or more microwave waveguides that couple the microwave to optical converter to the microwave resonator.

16. The system of claim 14, further comprising one or more optical waveguides that couple to the microwave to optical converter.

17. The system of claim 14, wherein the photon detector is configured to detect the optical signal by detecting one or more optical photons, the system further comprising a circulator configured to receive the microwave readout signal from the microwave resonator and transfer the microwave readout signal to the microwave to optical converter.

18. The system of claim 14, wherein the microwave to optical converter is a device selected from a group consisting of an electro-optic device, an opto-mechanical device, an opto-piezo-electric device, and a magneto-optic device.

19. The system of claim 14, wherein the microwave resonator is a microwave cavity.

20. The system of claim 14, wherein the microwave resonator, the qubit, and the microwave to optical converter are cooled to a predefined temperature.

21. The system of claim 20, wherein the predefined temperature ranges from about 0.01 to 0.1 kelvin.

22. The system of claim 14, further comprising a circulator connecting the microwave resonator and the microwave to optical converter.

23. A system for reading N qubits, the system comprising:
N microwave resonators coupled to the N qubits, the N microwave resonators configured to receive N microwave input readout signals at N microwave resonator frequencies and output N microwave output readout signals, wherein N is an integer; and
N microwave to optical converters configured to receive the N microwave output readout signals from the N microwave resonators, the N microwave output readout signals individually including a qubit state of the N qubits, wherein the N microwave to optical converters are configured to convert the N microwave output readout signals to N optical signals, wherein one of the N microwave output readout signals individually corresponds to one of the N qubits, wherein a photon detector is coupled to an output optical waveguide of the N microwave to optical converters, the N microwave to optical converters being separate devices from the photon detector, wherein ones of the N qubits are respectively defined to be in a predefined qubit state when corresponding ones of the N optical signals are detected by the photon detector as being output by corresponding ones of the N microwave to optical converters, wherein corresponding ones of the N qubits are defined to not be in the predefined qubit state when no corresponding ones of the N optical signals are output by corresponding ones of the N microwave to optical converters.

24. A readout system for reading one or more qubits, the readout system comprising:
one or more microwave waveguides;
one or more optical waveguides; and
one or more microwave to optical converters configured to receive one or more microwave readout signals corresponding to the one or more qubits via the one or more waveguides, wherein a photon detector is coupled to an output optical waveguide of the microwave to optical converter, the microwave to optical converter being a separate device from the photon detector, wherein the one or more microwave to optical converters are configured to output one or more optical signals for the one or more qubits being in a predefined qubit state via the one or more optical waveguides, wherein the one or more microwave to optical converters are configured to output no optical signals for the one or more qubits not being in the predefined qubit state.

25. The system of claim 24, wherein the one or more microwave waveguides, the one or more optical waveguides, and the one or more microwave to optical converters are set to a predefined temperature ranging from about 0.01 to 0.1 kelvin.

* * * * *